United States Patent [19]

U

[11] 4,144,586
[45] Mar. 13, 1979

[54] SUBSTRATE-FED INJECTION-COUPLED MEMORY

[75] Inventor: Aung S. U, Rangoon, Burma

[73] Assignee: International Telephone & Telegraph Corp., Nutley, N.J.

[21] Appl. No.: 793,449

[22] Filed: May 3, 1977

Related U.S. Application Data

[63] Continuation-in-part of Ser. No. 649,305, Jan. 15, 1976, abandoned.

[51] Int. Cl.² ................ H01L 27/10; G11C 11/40
[52] U.S. Cl. .................... 365/156; 307/238; 357/44; 357/45; 357/46; 357/92; 365/181
[58] Field of Search ............. 357/92, 44, 45, 46; 307/238; 365/154, 156, 174, 181

[56] References Cited

U.S. PATENT DOCUMENTS

| | | | |
|---|---|---|---|
| 3,643,235 | 2/1972 | Berger et al. | 357/92 |
| 3,815,106 | 6/1974 | Wiedmann | 357/92 |
| 4,056,810 | 11/1977 | Hart et al. | 357/92 |
| 4,081,697 | 3/1978 | Nakano | 357/92 |

Primary Examiner—William D. Larkins
Attorney, Agent, or Firm—John T. O'Halloran; Peter C. Van Der Sluys

[57] ABSTRACT

This relates to an integrated injection logic (I²L) bipolar memory cell employing both vertical and lateral injectors. The two embodiments disclosed have been optimized with respect to layout in a word-organized array such that coupling between surface regions and coupling to read/write-write/read lines can be manufactured during a single metallization step. To this end, the substrate forms the common injector of the vertical pnp transistors.

8 Claims, 8 Drawing Figures

SUBSTRATE-FED INJECTION-COUPLED MEMORY

CROSS-REFERENCE TO RELATED APPLICATIONS

This is a Continuation-in-Part Application of application Ser. No. 649,305; filed Jan. 15, 1976; entitled "(LVI) I$^2$L Bistable Design and Lateral and Vertical Injectors (LVI) I$^2$L Cell", now abandoned.

BACKGROUND OF THE INVENTION

This invention relates to an integrated injection logic (I$^2$L) bipolar memory cell and, more particularly, to an I$^2$L memory cell employing both vertical and lateral injectors.

Two basic but different types of I$^2$L memory cells are known. A first, described in "Superintegrated Memory Shares Functions on Diffused Islands" by S. K. Wiedmann and H. H. Berger, Electronics, Feb. 14, 1972, page 83, consists of two dual collector I$^2$L cells sharing the same injector. The base of each is cross-connected to a collector of the other cell. The remaining collector of each cell serves as a read/write-input/output terminal. The layout of this circuit in a word-organized array exhibits certain disadvantages. First, the P-type emitter (injector) occupies space which, in the long run, reduces density. Secondly, the source of voltage applied to the injector has to be applied to all P-type emitters of one word by means of a metal strip deposited during a second metallization step.

A second type of I$^2$L cell is described in "Injection-Coupled Memory: A High Density Static Bipolar Memory" by S. K. Wiedmann, IEEE Journal of Solid State Circuits, Vol. SC-8, No. 5, October, 1973, page 332. The cell consists of two single collector I$^2$L cells sharing one injector and having one exclusive injector for read/write-input/output functions. Thus, a total of three injectors per cell is required. To avoid the problem of dual metallization, the layout of this cell is modified so that the read/write injectors are shared between adjacent cells in the same word line. This requires complicated decoding techniques due to the multiple duties of the read/write injectors.

SUMMARY OF THE INVENTION

It is an object of the present invention to provide an I$^2$L bipolar memory cell, the fabrication of which requires only a single metallization step.

It is a further object of the present invention that the I$^2$L memory cell be more compact, thereby increasing density.

It is a further object of the present invention to provide an I$^2$L bipolar memory cell which retains an exclusive read/write capability, thereby reducing decoding complexity.

According to a broad aspect of the invention, there is provided an integrated injection logic (I$^2$L) bipolar memory cell, which is controlled by read/write-write/-read lines and is of the type which may be used in a word-organized array, comprising: a substrate having a first type semiconductivity, said substrate forming a common emitter; a first layer of semiconductive material of a second type conductivity disposed upon said substrate and having therein spaced regions of said first type conductivity material, which regions extend downwardly and are contiguous with said substrate; a second layer having said second type conductivity disposed upon said first layer and said spaced regions; first and second regions of semiconductive material having said first type conductivity disposed within said second layer and separated thereby, said first and second regions each having an exposed surface; third and fourth regions of semiconductive material having said second type conductivity disposed within said first region, each having an exposed surface; and fifth and sixth regions of semiconductive material having said second type conductivity disposed within said second region, each having an exposed surface, said fourth and fifth regions each coupled to one of said read/write-write/read lines, said third region coupled to said second region, said sixth region coupled to said first region, and said contiguous regions each located beneath dead space of one of said first and second regions.

The above and other objects of the present invention will be more clearly understood from the following detailed description taken in conjunction with the accompanying drawings, in which:

DESCRIPTION OF THE PREFERRED EMBODIMENT

Figure 1:
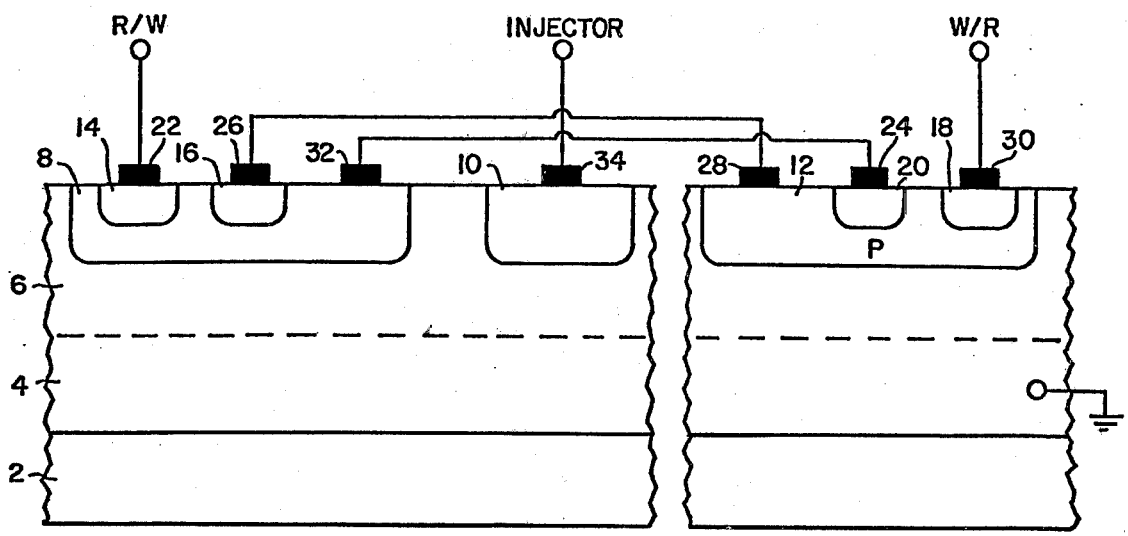
FIG. 1 is a sectional view of a first known type of I$^2$L memory cell.

FIG. 1 illustrates a first known type of I$^2$L memory cell of the type described in the first of the above cited references. The left portion of FIG. 1 is a cross-sectional view along line A—A of FIG. 2. The right portion of FIG. 1 is a cross-sectional view along line B—B of FIG. 2.

A buried layer 4 having an N+ type conductivity is diffused into a P-type substrate 2. An N-type epitaxial layer 6 is deposited on buried layer 4. The device contains two lateral pnp transistors and four vertical npn transistors. The first lateral pnp transistor comprises collection region 8, base region 6 and emitter region 10, and the second lateral pnp transistor comprises collector region 12, base region 6 and emitter region 10. The first and second vertical npn transistors comprise collector regions 14 and 16 respectively, base region 8 and an emitter region comprising regions 4 and 6. The third and fourth vertical transistors comprise collector regions 18 and 20 respectively, base region 12 and an emitter region which includes regions 4 and 6.

When current is supplied to injector region 10, the latter injects holes into the N-type epitaxial layer. A substantial number of these holes are collected by the adjacent P-type regions 8 and 12. Because of the near symmetrical structure, both P-type regions 8 and 12 collect approximately equal amounts of current.

Collector region 14 of the first vertical npn transistor is connected to a read line, and collector 20 of the fourth vertical npn transistor is connected to a write line. It should be understood, however, that the read and write lines may be reversed. The read line is connected to collector 14 via contact 22, and the write line is coupled to collector region 20 via a contact 24. Collector regions 16 and 18 are coupled to opposite base regions via contact regions 26, 28, 30 and 32. An injector contact region 34 is disposed on region 10.

The above-described structure functions as a flip-flop. Assume that the transistor, formed by N-type region 6, P-type region 12 and N-type region 18, is on. This will cause the base current $I_p$ to be drawn away from P-type region 8 provided, of course, that the inverse current gain is greater than 1. If the correspondingly opposite npn transistor is on, current is drawn away from P-type region 12. Thus, the structure operates as a flip-flop. Outer regions 14 and 20, as stated previously, couple the flip-flop to the read-write lines in an array organization.

Figure 2:
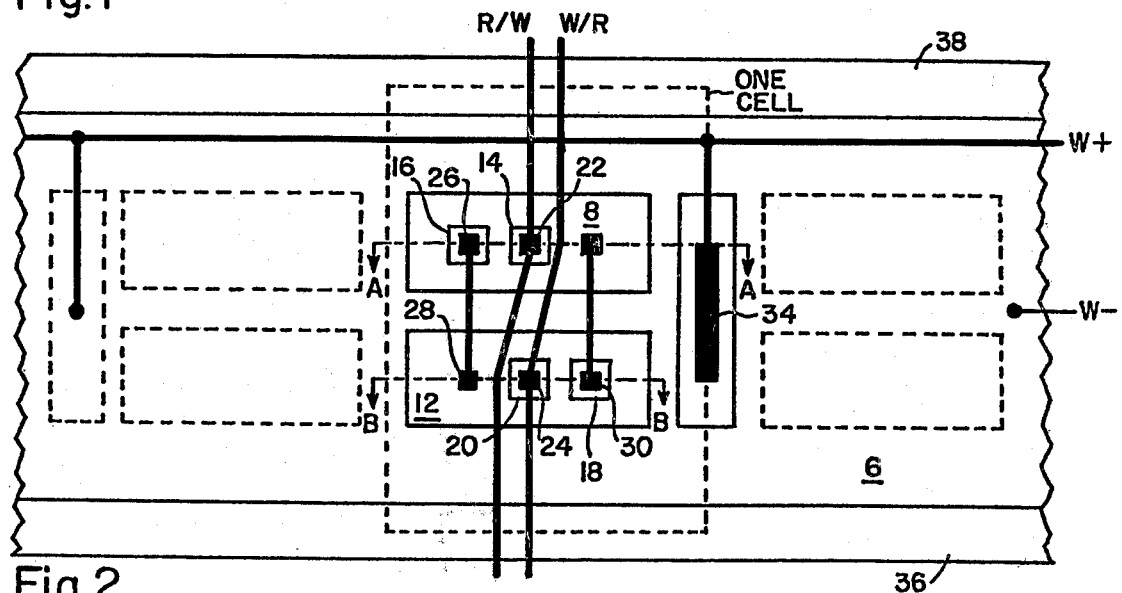
FIG. 2 illustrates the layout of the memory cell of FIG. 1 in a word-organized array.

FIG. 2 illustrates the memory cell shown in FIG. 1 in a word-organized array. Like regions have been denoted with like numerals. In this layout, all memory cells belonging to a common word line pair ($W_+$ and $W_-$) are embedded in a common isolated N-type strip. Also, two P+ type isolation regions 36 and 38 are shown. These regions provide isolation between adjacent words in the array. The $W_-$ line is simply the common N-type strip between the above referred to isolation regions, whereas the $W_+$ line is a metal strip deposited in a second metallization step. The $W_+$ line connects all P-type emitters of a single word. The read-write transistors are connected to a read-write metal line pair perpendicular to the N-type strip. It can be seen that the $W_+$ line crosses the read and write lines making it necessary that the $W_+$ line be deposited during a second metallization step. Also, as is clear from FIG. 2, the P-type emitter (injector) requires a significant amount of space.

It can be seen that if the lateral P-type emitter (injector) could be made vertical, and the $W_+$ line placed under the N-type epitaxial region, then the requirement for a second metallization step is eliminated and the resultant structure is a more compact memory cell.

Figure 3:
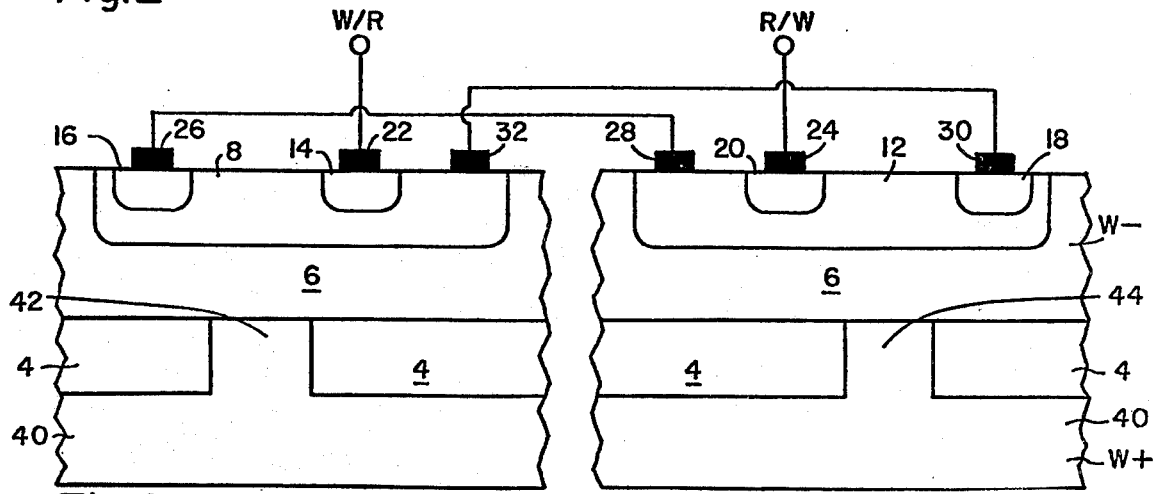
FIG. 3 is a sectional view of a first I$^2$L memory cell according to the present invention.

By opening the N+ type buried layer, vertical pnp transistor action is made possible. In FIG. 3, windows 42 and 44 have been opened in the N+ buried layer. Again, the left portion of FIG. 3 is a cross-sectional view along line A—A of FIG. 4, and the right portion of FIG. 3 is a cross-sectional view along line B—B of FIG. 4. The structure now includes two vertical pnp transistors. The first comprises collector region 8, base region 6 and emitter region 40. The second comprises collector region 12, base region 6 and emitter region 40. The substrate 40, which now forms the emitter of the vertical pnp transistors, now has a P+ type conductivity. The remaining structure is similar to that shown in FIG. 1 with the exception that the common injector 10 in FIG. 1 has been eliminated.

Figure 4:
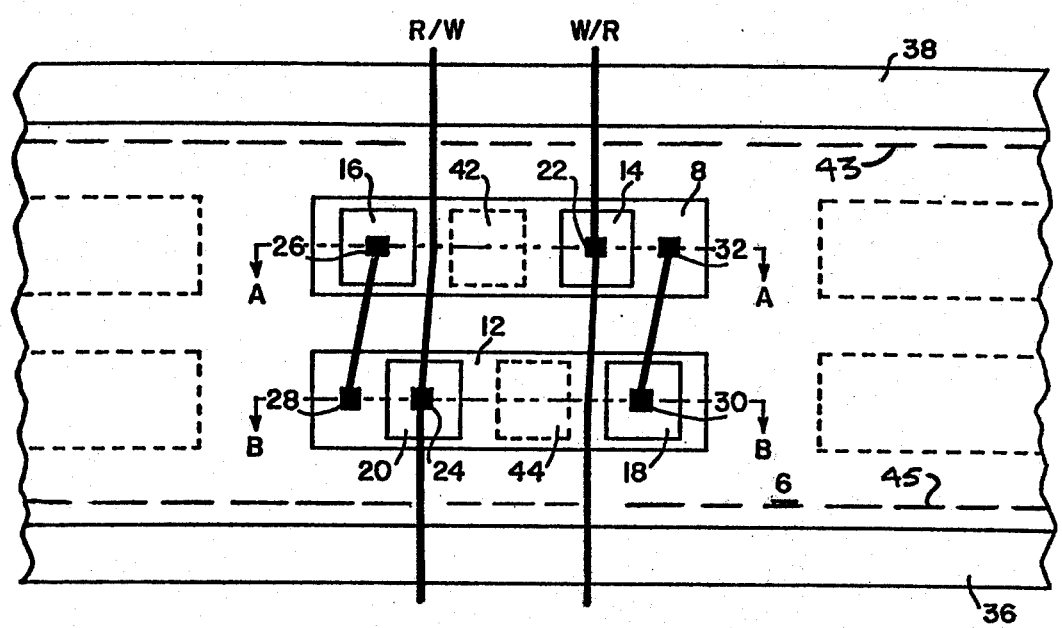
FIG. 4 illustrates the layout of the memory cell of FIG. 3 in a word-organized array.

The layout of the memory cell, shown in FIG. 3, is shown in a word-organized array in FIG. 4. Like regions have been denoted with like reference numerals. The dotted regions 42 and 44, correspond to the windows through the N+ type buried layer shown in FIG. 3. The N+ buried layer is also shown in FIG. 4 as being bounded by dotted lines 43 and 45. It is to be noted that the openings in the buried layer occupy the dead space of the cell (space between regions 14 and 16 and space between regions 18 and 20), thereby not requiring the allocation of any additional space. Further, the space which was occupied by the lateral P-type emitter in FIG. 2 has been eliminated, the logical result being a higher density. The $W_+$ line is now the P+ type substrate 40, shown in FIG. 3; therefore, a second metallization step is no longer required. It should further be noted that the layout is such as to simplify electrical coupling; i.e. contact 32 is located proximate to contact 30, and contact 26 is located proximate to contact 28. As a result, the metallized interconnects for contacting appropriate regions together and the metallized interconnects which form the read/write-write/read lines are non-intersecting and can be produced during a single metallization step. Also since injection windows 42 and 44 of the vertical pnp transistors are located beneath dead space of regions 8 and 12, interaction of the vertical pnp transistors with the other active elements is minimized.

To perform a "read" operation in the array shown in FIG. 4, the common buried layer 4 (FIG. 3) is pulled down in voltage via W— with respect to the substrate 40 (W+). When biased in this manner, the potentials of the R/W and W/R lines may be sensed to establish the state of the cell selected.

To "write" the appropriate R/W or W/R line is pulled down to the same potential as the buried layer (W—). The buried layer of other non-selected row cells is biased lower than that of the selected row cells.

Figure 5:
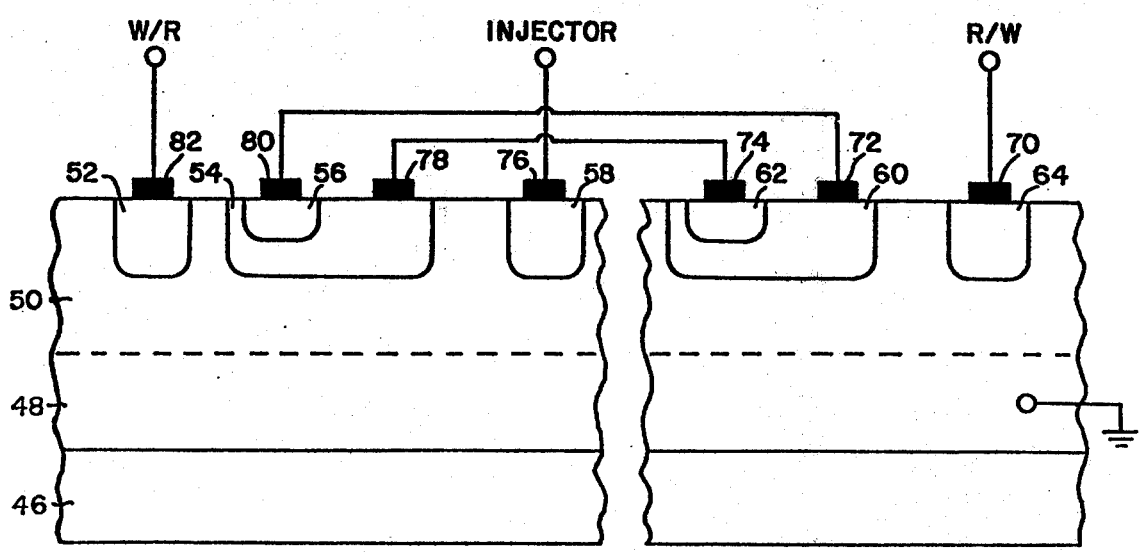
FIG. 5 is a sectional view of a second known type of I$^2$L memory cell.

FIG. 5 is a cross-sectional view of another known type of I²L memory cell. The cell includes two cross-coupled npn transistors sharing one injector 58. As in the previous known type, an N+ type buried layer 48 is diffused into P-type substrate 46. Similarly, an N-type epitaxial layer 50 is deposited upon buried layer 48. The first transistor includes an N-type collector region 56, a P-type base region 54, and N-type emitter region 50. The second transistor includes N-type collector region 62, P-type base region 60 and N-type emitter region 50. These cross-coupled npn transistors are operated in the inverse mode with the N-type epitaxial layer acting as the emitter for both transistors. The base current results from minority carriers that are injected from the P-type injector region 58 into N-type epitaxial region 50 and essentially collected by the adjacent P-type base regions 54 and 60. Due to the near symmetrical structure, both currents are about equal. If the current gain of the inverse npn transistors is greater than one, a bistable operation is achieved. Thus, the structure represents a flip-flop with controllable constant current-load devices. These load devices include two lateral pnp transistors whose common bases are coupled to the common emitters of the vertical npn transistors, and whose collectors are tied to the bases of the corresponding npn transistors (P-type regions 54 and 60).

To extend this flip-flop device to a memory cell, two outer P-type regions 52 and 64 are added for coupling to read/write data lines. The lines are coupled via contact regions 82 and 70 respectively. Collector region 56 is coupled via contact 80 to base region 60 via contact 72. Collector region 62 is coupled to base region 54 via contact regions 74 and 78.

In order to avoid the requirement of dual metallization in this known type of cell, the cell is modified as described in the second of the above cited references so that the read/write injectors are shared between adjacent cells in the same word line. This requires complicated decoding techniques due to the multiple duties of the read/write injectors.

By using vertical pnp injection techniques, a new cell is made possible which retains exclusive read/write capability, thereby requiring only simple decoding and still only requires a single metallization step. Also, the cell inherently contains fewer parasitics enhancing performance.

Figure 6A:
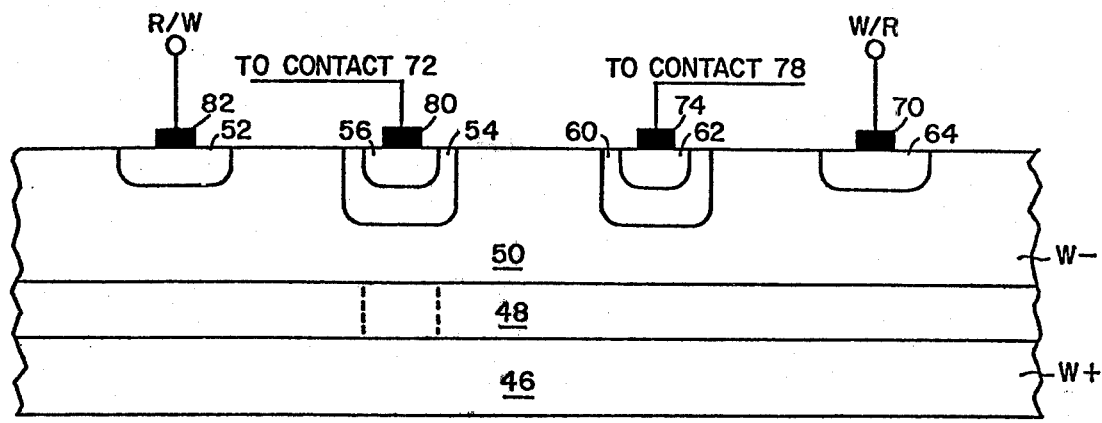
FIGS. 6a and 6b are sectional views of a second I$^2$L memory cell according to the present invention.
Figure 6B:
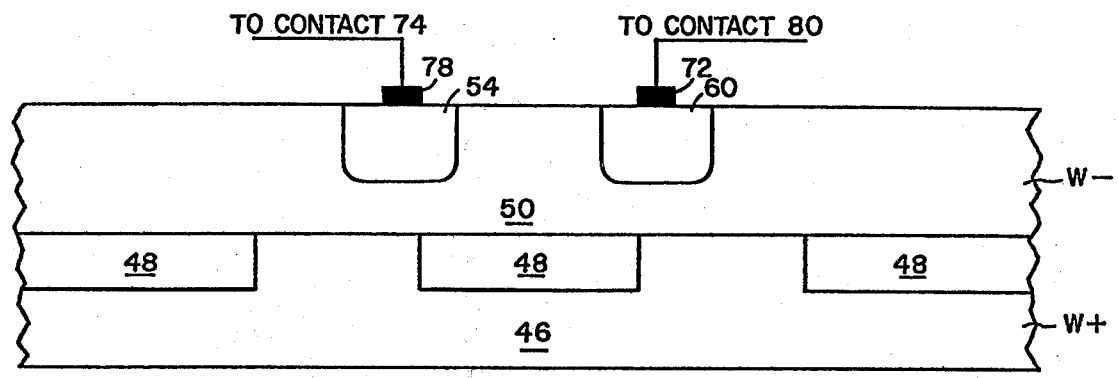
Figure 7:
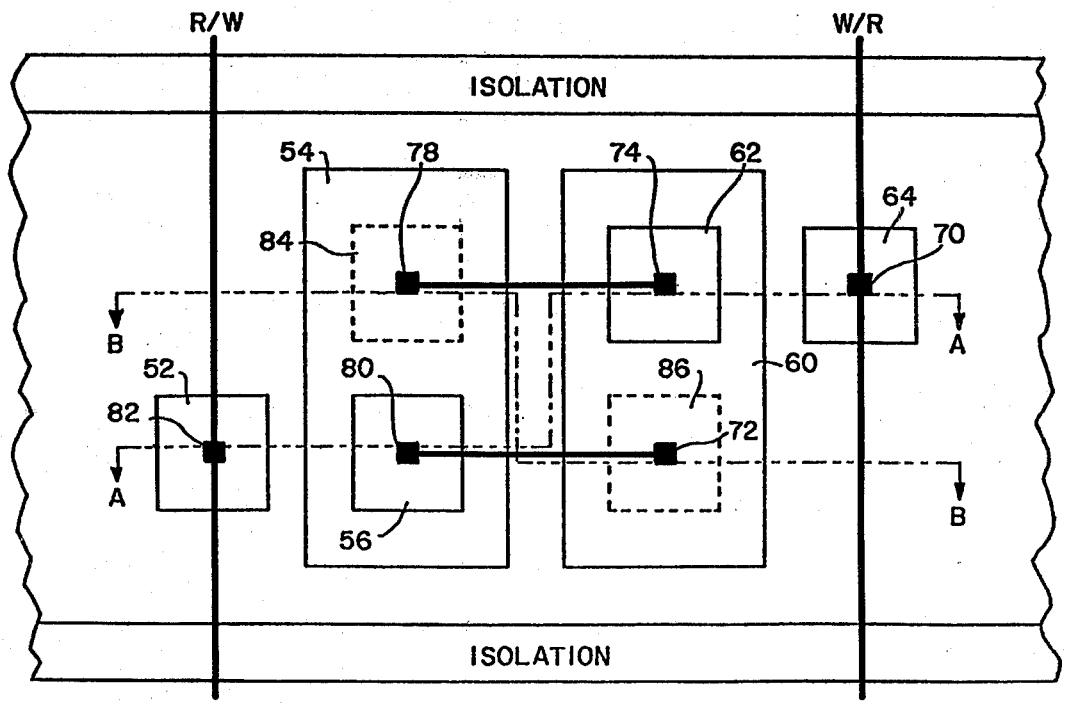
FIG. 7 illustrates the layout of the memory cell of FIG. 6 in a word-organized array.

FIGS. 6a and 6b are cross-sectional views of the second improved type of I²L cell employing vertical pnp injection taken along lines A—A and B—B of FIG. 7 respectively. It can be seen that the common injector region shown in FIG. 5 has been eliminated. Further, windows 84 and 86 in the N+ type buried layer 48 have been provided beneath base regions 54 and 60 respectively.

The first vertical pnp transistor comprises collector region 54, base region 50 and emitter region 46. The second vertical pnp transistor comprises collector region 60, base region 50 and P+ region 46 as the emitter. All other regions are the same as those shown in FIG. 5 and are denoted with similar reference numerals. These similar regions make up the above referred to vertical npn transistors and lateral pnp transistors.

The layout of this lateral and vertical injector (LVI) bistable cell is shown in FIG. 7. Like regions have been denoted with like reference numerals. As stated previously, the common injector region of FIG. 5 has been eliminated, thereby resulting in a cell which has at least a comparable compactness as the cell described in the second cited reference. Further, since the common injector has been omitted, easier decoding is possible, and it is easier to reduce parasitic components. Since the new lateral-vertical injection (LVI) cell occupies at most the same space as the above described known cell, larger active component sizes are possible, resulting in a better yield. Again, since the W+ line is the P+ type substrate, the need for a second metallization step has been eliminated. Finally, the layout is such as to simplify electrical coupling; i.e. contact 74 is proximate to contact 78 and contact 72 is proximate to contact 80. Further, coupling between these contacts does not interfere with the read/write lines as shown in FIG. 7. Therefore, only a single metallization step is required to produce the required metallized interconnects and the read/write-write/read metallized interconnects.

Figure 8:
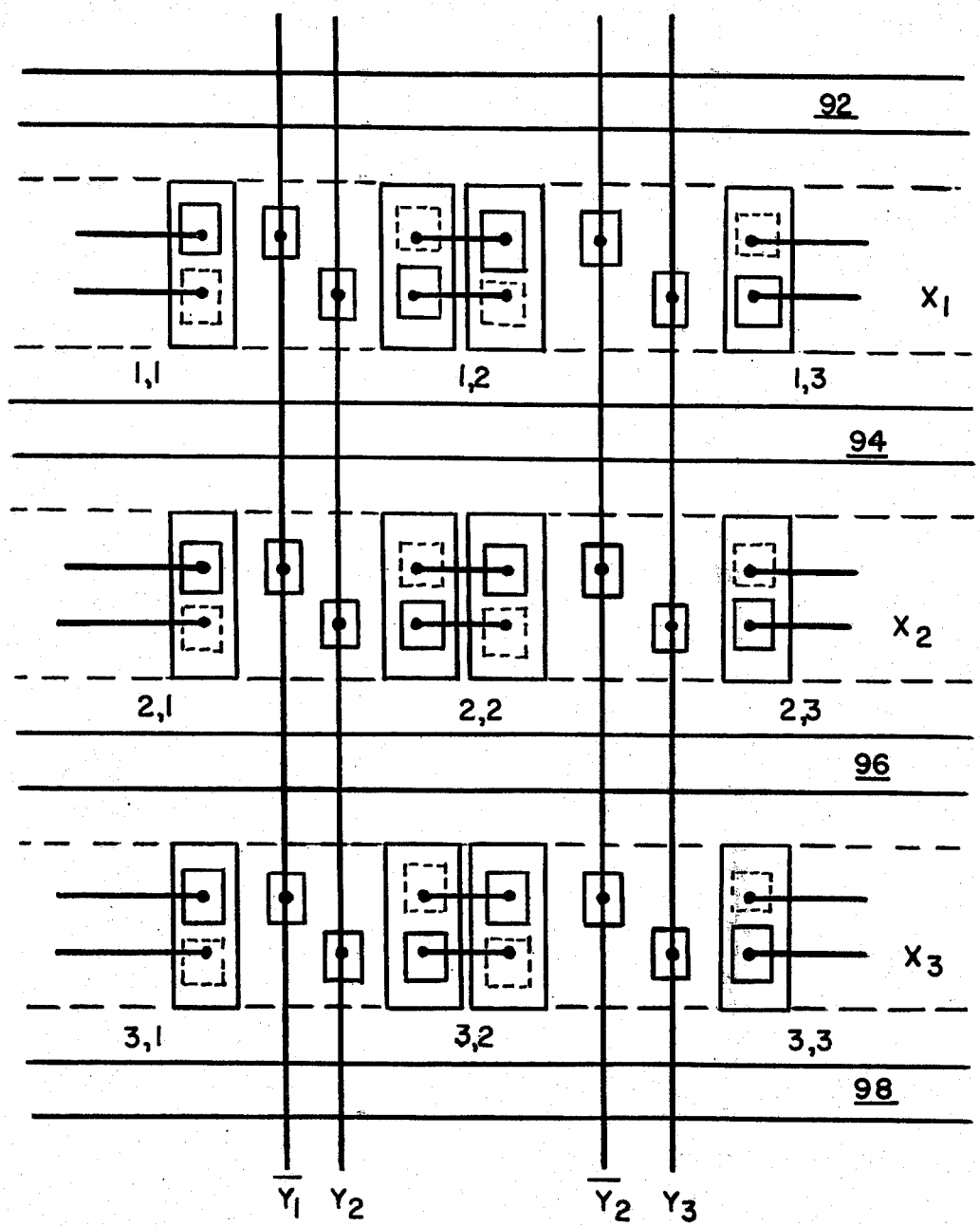
FIG. 8 illustrates a word-organized array using the memory cell of FIG. 6.

For the purpose of explaining how the cell of FIGS. 6a, 6b and 7 may be written into and read from, FIG. 8 illustrates an array having three rows of cells $X_1$, $X_2$ and $X_3$ separated by isolation regions 92, 94, 96 and 98, and three columns $Y_1$, $Y_2$ and $Y_3$. For the "read" and "write" operations, two voltage levels Vmid and Vlow, both of which are below the substrate potential (W+) are required so that W+ > Vmid > Vlow.

If, for example, it were desired to read the contents of cell 2,2 then:

$$Vx_2 \approx Vy_2 = V\bar{y}_2 = Vlow$$

where $Vx_2$ is the voltage of the buried layer (shown in dotted lines) in row $X_2$.

For the unaddressed cells in the same row (cells 2,1 and 2,3):

$$Vx_2 \approx Vlow; \text{ and}$$

$$V\bar{y}_1 = Vy_3 = Vmid.$$

For the unaddressed cells in the same column (cells 1,2 and 3,2):

$$Vx_1 = Vx_3 \approx Vmid; \text{ and}$$

$$Vy_2 = V\bar{y}_2 = Vlow.$$

To write into cell 2,2:

$$Vx_2 \approx Vlow;$$

$$Vy_2 = Vmid; \text{ and}$$

$$V\bar{y}_2 = Vlow.$$

For unaddressed cells in the same row (cells 2,1 and 2,3);

$$Vx_2 \approx Vlow; \text{ and}$$

$$Vy_1 = Vy_3 = Vlow.$$

For unaddressed cells in the same column (cells 1,2 and 3,2)

$$Vx_1 = Vx_3 \approx Vmid;$$

$$Vy_2 = Vmid; \text{ and}$$

$$V\bar{y}_2 = Vlow.$$

It should be noted that the I²L memory cell shown in FIGS. 3 and 6a and b can be manufactured by techniques which are standard and well known to those skilled in the art of manufacturing semiconductor circuits. For example, referring to FIG. 3, the P-type substrate 40 is supplied with an oxidization layer, and using standard masking and etching techniques, the oxide layer is removed where the buried N+ diffusion is required. An N+ dopant is then diffused into the exposed regions of the substrate. After removal of the remaining oxidization layer, the epitaxial region 6 is then grown on the substrate having the N+ regions diffused therein, and a second oxidization layer is provided on the epitaxial layer. Windows are then opened in this second oxidization layer through which a P+ type dopant can be diffused for isolation purposes.

Using a third oxide layer, windows are opened therein to accomplish the required base diffusion, and through windows in a subsequently produced fourth oxide layer, the remaining diffused regions are produced.

A fifth oxide layer and windows therein is employed to provide the required metal deposition. It is to be repeated that the above processes are accomplished using standard masking and etching techniques.

While the principles of this invention have been described above in connection with specific apparatus, it is to be understood that this description is made only by way of example and not as a limitation on the scope of the invention as set forth in the objects and features thereof and in the accompanying claims.

What is claimed is:

1. An integrated injection logic (I²L) bipolar memory cell which is controlled by read/write-write/read lines and is of the type which may be used in a word-organized array, comprising:
   a substrate having a first type semiconductivity forming a common emitter;
   a first layer of semiconductive material of a second type conductivity disposed upon said substrate and having therein spaced regions of said first type conductivity, which regions extend downwardly and are contiguous with said substrate;

a second layer having said second type conductivity disposed upon said first layer and said spaced regions;

first, second, third and fourth regions of semiconductive material having said first type conductivity disposed within said epitaxial layer and separated thereby, said first, second, third and fourth regions each having an exposed surface; and fifth and sixth regions of semiconductive material having said second type conductivity each having an exposed surface, each one of said fifth and sixth regions disposed in one of said first and second regions respectively, said fifth region coupled to said second region, said sixth region coupled to said first region, said third and fourth regions coupled to one of said read/write-write/read lines, and said contiguous regions each located beneath dead space of said first and second regions.

2. An integrated injection logic ($I^2L$) bipolar memory cell according to claim 1 wherein said substrate and said first, second, third and fourth regions have a P-type conductivity and wherein said second layer and said fifth and sixth regions have an N-type conductivity.

3. An integrated injection logic ($I^2L$) bipolar memory cell according to claim 2 wherein said second layer is an epitaxial layer.

4. An integrated injection logic ($I^2L$) bipolar memory cell according to claim 3 wherein said first layer has an N+ type conductivity.

5. An integrated injection logic ($I^2L$) bipolar memory cell according to claim 1 wherein the exposed surfaces of said first and second regions have a substantially rectangular shape, a longer side of said first region juxtaposed substantially parallel to a longer side of said second region, and wherein said fifth region is positioned opposite the dead space of said second region and said sixth region is positioned opposite the dead space of said first region, and wherein said third and fourth regions and the read/write-write/read lines attached thereto flank said third and fourth regions.

6. An integrated injection logic ($I^2L$) bipolar memory cell according to claim 5 wherein said read/write-write/read lines contact said third and fourth regions respectively and are first and second metallized interconnects which extend substantially parallel to said longer sides.

7. An integrated injection logic ($I^2L$) bipolar memory cell according to claim 6 wherein said first region is coupled to said sixth region by a third metallized interconnect and said second region is coupled to said fifth region by a fourth metallized interconnect, said third and fourth metallized interconnects are substantially perpendicular to said longer sides.

8. An integrated injection logic ($I^2L$) bipolar memory cell according to claim 7 wherein said first, second, third and fourth metallized interconnects are co-planar and non-intersecting and are applied during a single metallization step.

* * * * *